United States Patent [19]
Ping et al.

[11] Patent Number: 5,659,245
[45] Date of Patent: Aug. 19, 1997

[54] ESD BYPASS AND EMI SHIELDING TRACE DESIGN IN BURN-IN BOARD

[75] Inventors: King-Ho Ping, Tainan; Jian-Hsing Lee, Hsin-chu, both of Taiwan

[73] Assignee: Taiwan Semiconductor Manufacturing Company, Ltd., Hsin-Chu, Taiwan

[21] Appl. No.: 658,524

[22] Filed: Jun. 3, 1996

[51] Int. Cl.⁶ ............................................ G01R 31/02
[52] U.S. Cl. .................................. 324/158.1; 324/755
[58] Field of Search ............................ 324/760, 755, 324/158.1; 174/35 R; 361/818

[56] References Cited

U.S. PATENT DOCUMENTS

| | | | |
|---|---|---|---|
| 4,954,929 | 9/1990 | Baran | 361/818 |
| 4,970,625 | 11/1990 | Belanger et al. | 361/818 |
| 5,383,097 | 1/1995 | DeLucia et al. | 361/816 |
| 5,386,346 | 1/1995 | Gleadall | 361/799 |
| 5,389,001 | 2/1995 | Broschard, III et al. | 439/159 |
| 5,406,105 | 4/1995 | Lee | 257/355 |
| 5,537,294 | 7/1996 | Siwinski | 361/818 |

Primary Examiner—Ernest F. Karlsen
Attorney, Agent, or Firm—George O. Saile

[57] ABSTRACT

A burn-in board assembly for the protection of integrated circuit modules from Electrostatic discharge and the shielding of said integrated circuit modules from Electromagnetic Interference during said electrostatic discharge is described. The burn-in board assembly has a printed circuit board onto which the integrated circuits are mounted by soldering or plugging into sockets soldered to said burnin board assembly. Disposed upon the printed circuit board is a plurality of input stimuli, feedback sensing, and output response signal traces to connect the integrated circuit modules to a connector that is coupled to a input stimulus generator and feedback sensing and output response monitor. Also disposed upon the printed circuit board is a plurality of ground traces and voltage supply traces to connect the integrated circuit modules to the connector that is coupled to a voltage supply source and the system ground reference point. An electrostatic discharge bypass track is disposed peripherally upon the printed circuit board and is connected to the ground reference point through the connector to prevent damage to the printed circuit modules during an electrostatic discharge event. A first and a second electromagnetic interference shielding trace is disposed upon the printed circuit board. Each electromagnetic shielding trace is connected at opposite ends to the ground reference point through the connector to shield the printed circuit traces from the effects of the electromagnetic interference.

22 Claims, 2 Drawing Sheets

ESD BYPASS AND EMI SHIELDING TRACE DESIGN IN BURN-IN BOARD

BACKGROUND OF THE INVENTION

1. Field of the Invention

This invention relates to techniques for the suppression of electrostatic discharge (ESD) and electromagnetic interference and in particular the design of printed circuit board assemblies for the burn-in process during the conducting of life-time qualification testing of integrated circuits (IC) modules that will suppress ESD and EMI.

1. Description of Related Art

Many of the failures that may occur in IC modules can be stimulated to occur sooner by exposing the IC modules to elevated temperatures and power supply voltages. After the completion of manufacture of IC modules, the IC Modules are often "burned-in," where the IC modules are placed in a chamber for exposure to elevated voltage and temperature. The period of the burn-in is usually on the order of 8 to 1000 hours, dependent on the objective of the qualification process. Of the IC modules input terminals are stimulated with operating signals in the meanwhile these terminals are monitored for operation to detect the exact time of failure.

During the preparation for the burn-in handling there is an opportunity for the IC modules to be exposed to ESD voltages and to EMI sources. The ESD voltages could destroy the IC modules and the FMI sources could corrupt the function of the IC modules during the burnin testing.

The suppression of ESD in the design of printed circuit card retention assemblies is shown in U.S. Pat. No. 5,389,001 (Brouschard, III et al.). While U.S. Pat. No. 5,383,097 (DeLucia, et al.) teaches a technique for shielding hand-held electronic devices from ESD.

U.S. Pat. No. 5,386,346 (Gleadall) shows a design for a printed circuit card retention assembly for the suppression of EMI emissions. To protect IC's at the circuit level U.S. Pat. No. 5,406,105 (Lee) demonstrates a design for the protection of IC's at the circuit level with an ESD protection circuit.

A burn-in board assembly is shown in FIG. 1. The assembly is to provide a carrier for testing many IC modules. Many burn-in boards are placed in a burn-in chamber to process large volumes IC modules at one time.

A printed circuit board 10 has many IC modules 20 plugged into sockets that are mounted on it. Wiring traces 70, 80 are connected to each IC module 20. The input stimuli wiring traces 70, between the power supply voltage source terminals (+V) 45 and the system ground reference point terminals (GND) 40, provide the operating input signals to the IC modules 20 and the feedback sensing and the output responses from the IC modules 20 are placed on the output response traces 80, that are located, between the +V terminal 45 and the GND terminal 40 on the side opposite the input stimuli traces 70. The ground reference connections for each IC module 20 is connected to the ground wiring traces 75. The voltage supply connection for each IC module 20 is connected to the voltage wiring traces 85.

All of the wiring traces 70, 75, 80, 85 are connected to the connector 30. The connector 30 is coupled to the system ground reference point through connector terminals 40. The connector 30 also is coupled to a power supply voltage source through connector terminals 45. System input stimuli are coupled through the top side of the connector 30 to the input stimuli wiring traces 70, that are located between the +V terminal 45 and the GND terminal 40, and the system feedback sensing and output response monitor is coupled through the connector 30 to the feedback sensing and output response wiring traces 80, that are located between the power supply voltage source terminals (+V) 45 and the system ground reference point terminals (GND) 40.

An aluminum stiffener 50 is attached to the printed circuit card 10 to prevent the printed circuit card for excessive flexing under a high temperature burnin process. The handle 60 is connected to the aluminum stiffener 50 so that operations personnel are able to move the burn-in assembly during preparation for testing, and during post burn-in handling. The handling provides an opportunity for the exposure of the burn-in assembly to ESD voltages and EMI sources, such as the generation of EMI fields during an ESD event.

SUMMARY OF THE INVENTION

An object of this invention is the suppression of ESD from the contact of a burn-in board assembly by an ESD voltage source such as the human body. Furthermore an object of this invention is the suppression of EMI that may be generated during the conduction of current from ESD sources. The ESD could destroy IC modules plugged into sockets that are mounted on the burn-in board assembly and the EMI will interfere with the operation of the IC modules during the burn-in testing.

To accomplish the above objects, a burn-in board assembly has a printed circuit board onto which many IC modules are plugged into the sockets that are mounted in an area of said printed circuit board. A stiffener frame is connected to the printed circuit board to provide physical support for said burn-in board assembly. A handle is connected to the stiffener so that the assembly can be easily moved before and after the burn-in process.

A set of input signal traces are placed on the printed circuit board to couple all the input terminals on a connector to all the input terminals of each of the IC modules. A set of feedback sensing signal traces are placed on the printed circuit board to couple all the feedback sensing monitor terminals on the connector to all the signal terminals of each of the IC modules. A set of voltage traces are placed on the printed circuit board to couple voltage supply terminals of the connector to all the voltage supply terminals of each of the IC modules. An a set of ground reference traces are placed on the printed circuit board to connect the ground reference terminals of the connector to the ground reference terminals on each of the IC modules. The connector is connected with a mating connector within the burn-in chamber to couple the input terminals, the feedback sensing terminals, the voltage supply terminals, and the ground reference terminals to an input stimuli generator, an feedback sensing monitor, a voltage power supply, and a ground reference point respectively that are the external control and test circuitry for the burn-in chamber.

An ESD bypass track is disposed upon the printed circuit board around its periphery and connected to the ground terminals of the connector. The aluminum frame is connected to the ESD bypass track to provide a low resistance path for the human body ESD source to ground, when an operator will load and unload a burnin board from a burnin oven by hand, pushing or pulling said burnin board from said burnin oven.

A first EMI trace is disposed upon the printed circuit board around its periphery between the ESD bypass track and the area of the IC modules and connected at one end of said first ESD trace to one or more of the ground terminals of the connector. A second EMI trace is disposed upon the printed circuit board around its periphery between the first EMI trace and the area of the IC modules and is connected at an end opposite the connection of the first EMI trace to one or more of the ground terminals of the connector.

DETAILED DESCRIPTION OF THE INVENTION

Figure 1:
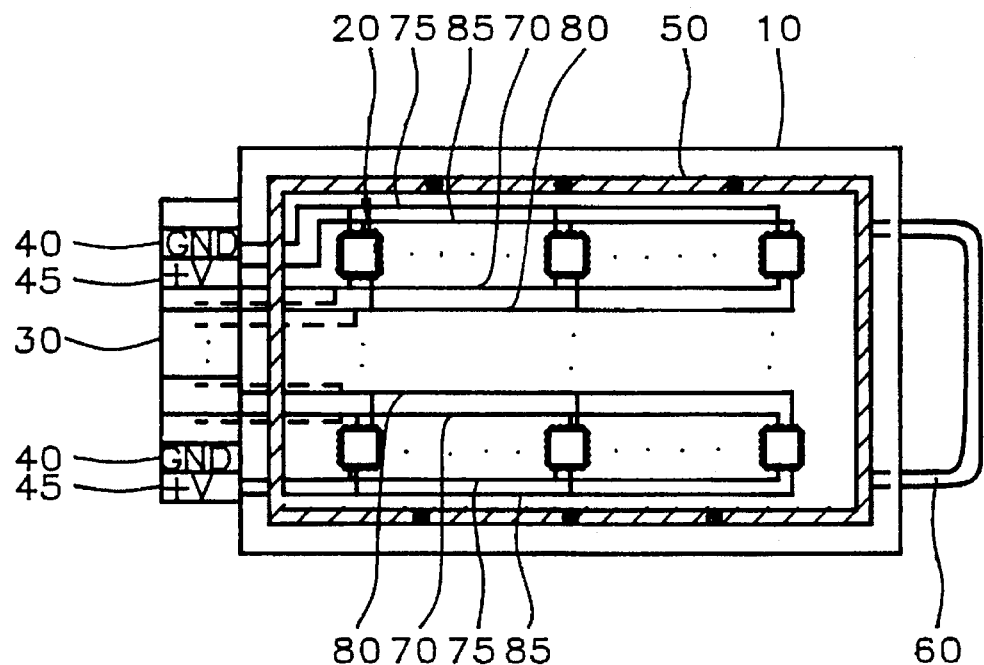
FIG. 1 is a view of a burn-in board assembly of prior art.
Figure 2:
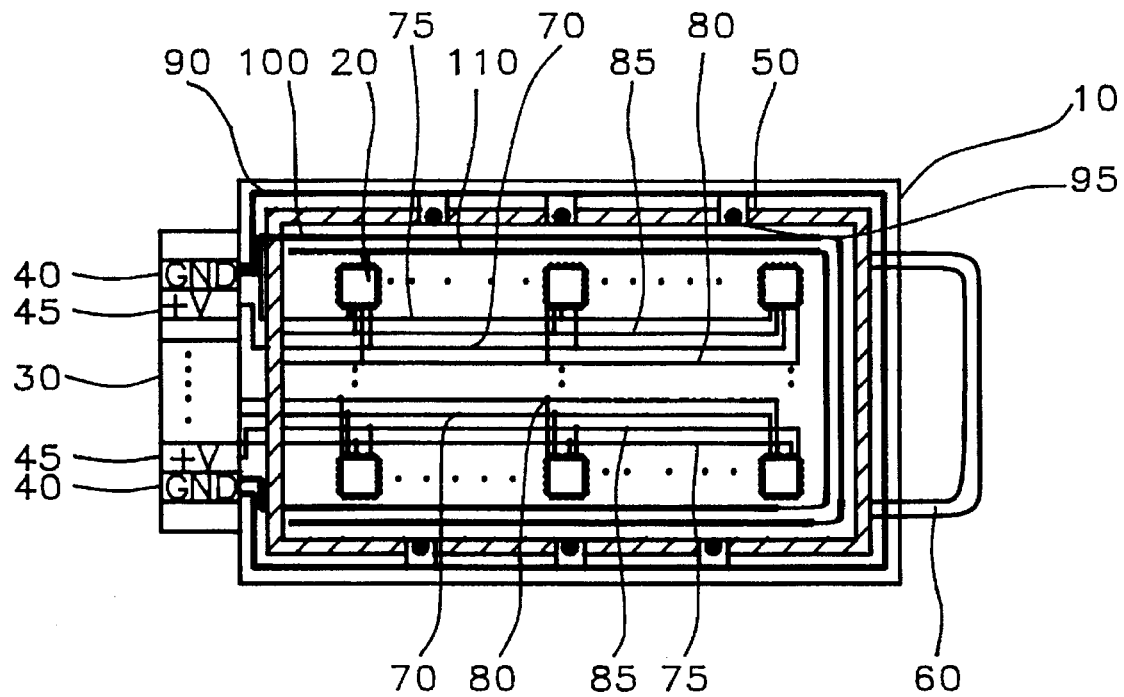
FIG. 2 is a view of a burn-in board assembly of this invention.

A burn-in board assembly is illustrated in FIG. 2. The burn-in assembly has a printed circuit board 10 onto which a plurality of IC modules 20 are mounted or plugged into sockets mounted on said printed circuit board. Input stimuli traces 70, that are located between the power supply voltage source terminals (+V) 45 and the system ground reference point terminals (GND) 40 are connected to each of the integrated circuit modules 20 to provide operating signal input to said IC modules 20. Feedback sensing traces 80, that are located between the power supply voltage source terminals (+V) 45 and the system ground reference point terminals (GND) 40 on the side of the printed circuit board 10 opposite the input stimuli traces 70, are connected to each of the IC modules 20 to monitor the feedback sensing signals and the output responses from the IC Modules 20. The ground reference connection for each IC module 20 is connected to ground wiring traces 75. The voltage supply traces 85 are connected to voltage supply terminals on each of the IC modules 20.

All wiring traces 70, 75, 80, 85 are connected to a connector 30. The connector 30 is couples to a system ground reference point through connector terminals 40. The voltage supply source is connected to the connector 30 through connector terminals 45. The system input stimuli are coupled through the connector 30 to provide a plurality of channels of stimuli with different timing rates for the integrated circuits 20 and the feedback sensing and output response monitor is coupled through the connector 30 to the feedback sensing traces 80, that are located between the power supply voltage source terminals (+V) 45 and the system ground reference point terminals (GND) 40 on the side of the printed circuit board 10 opposite the input stimuli traces 70.

In order to prevent the printed circuit board from flexing, an aluminum stiffener 50 is attached to the printed circuit board 10. A handle 60 is connected to the aluminum stiffener 50 so that operating personnel are able to move the burn-in assembly during preparation for burn-in testing and during post burn-in processing.

The aluminum stiffener 50 is attached to the ESD bypass wiring tracks 90 with fasteners 95. This is to provide a path to ground reference for a electrostatic discharge voltage that is created by the movement of the operation personnel in the handling of the burn-in assemblies.

To shield the IC modules 20 from EMI created by the flow of ESD current in the aluminum stiffener 50 and the ESD bypass tracks, EMI shielding tracks 100, 110 are disposed upon the printed circuit board 10. The first EMI shielding track 100 is connected at one end to the ground terminal 40 of the connector 30 and placed peripherally around the printed circuit board 10 between the aluminum stiffener 50 and the area of the IC modules 20. The second EMI shielding track 110 is disposed on the printed circuit board 10 between the first EMI shielding track 100 and the area of the IC modules 20. The second EMI shielding track 110 is connected to the ground terminal 40 of the connector 30 at the end of the second EMI shielding track 110 opposite the ground connection of the first EMI shielding track 100.

This placement of the first and second EMI shielding tracks 100, 110 is such that when an ESD current is flowing in the aluminum stiffener 50, the EMI generated by this current induces a current in each of the first and second EMI shielding tracks 100, 110. This current in the first EMI shielding track 100 is in an opposite direction to the current in the second EMI shielding track 110. These opposing current create EMI fields that cancel each other and thus prevent EMI from effecting the IC modules 20.

Figure 3:
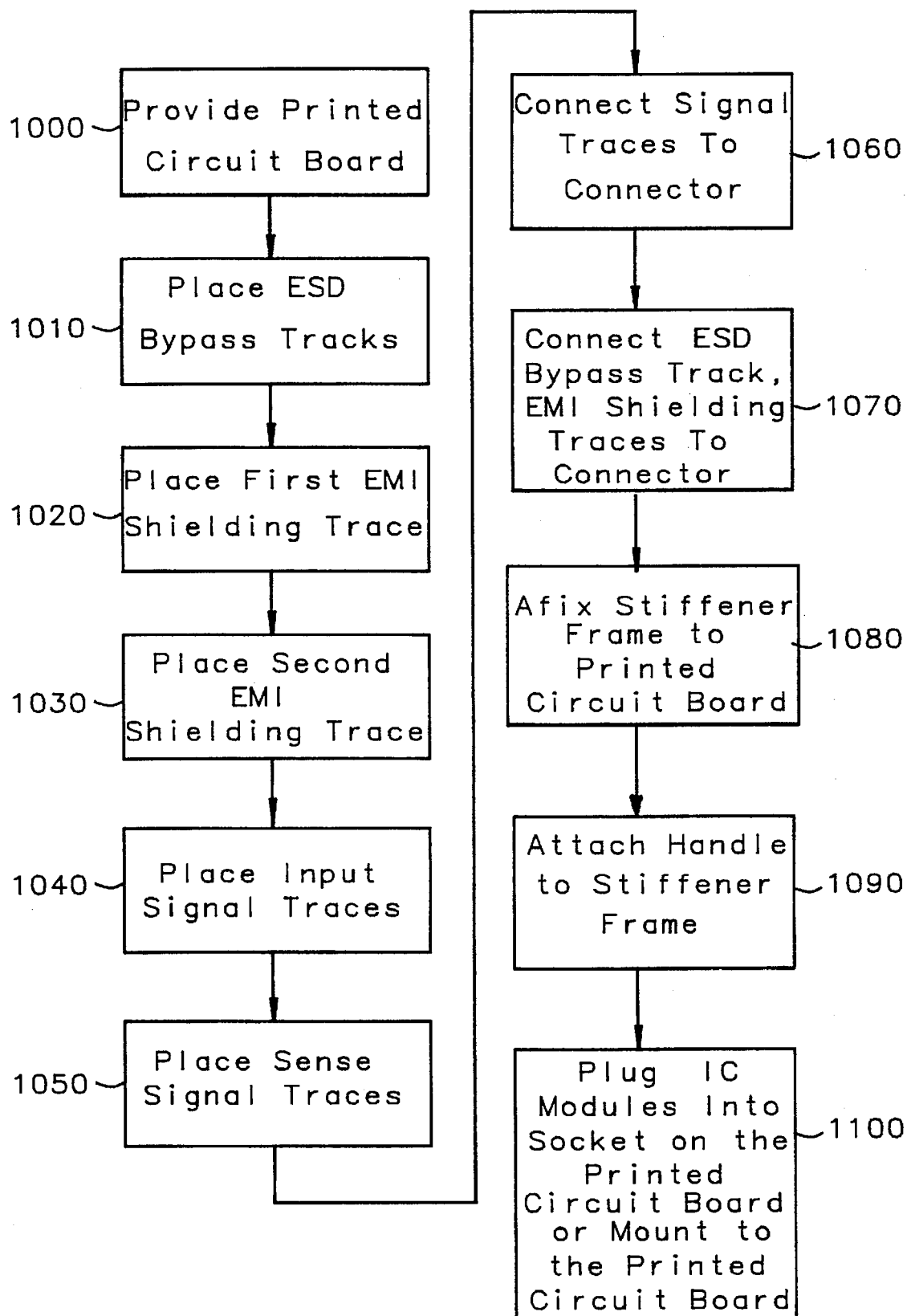
FIG. 3 is a flow diagram of a method for the suppression of ESD and EMI for this invention.

In FIG. 3 a flow chart of the method to divert current from an ESD source to a ground reference point and to suppress EMI generated during the ESD even in a burn-in assembly is shown. The first step is to provide a printed circuit card with an area for the mounting of IC sockets or modules 1000. An ESD bypass track is then placed on the periphery of the printed circuit card. Next a first EMI shielding track is placed on the periphery of the printed circuit card, between the area of the IC modules and the ESD bypass track 1020. A second EMI shielding track is then placed between the first EMI shielding track and the area of the IC modules 1030. The input signal traces are then placed in the area of the IC modules to provide the input signal stimuli signals during the burn-in process 1040. The feedback sensing signal traces are then placed in the area of the IC modules to monitor the feedback stimulus and response of the IC modules during the burn-in process 1050. The input and feedback sensing signal traces are then connected to the connector which is connected to the sources of the input stimuli and the monitors of the input stimuli and responses. Then the ESD bypass track and one end of each of the first and second EMI shielding tracks are connected to the ground terminals of the connector 1070. These terminals are connected to the system ground reference point.

An aluminum frame is affixed to the printed circuit so as to make contact to the ESD bypass tracks 1080. A handle is attached to the aluminum frame to allow operating personnel to move the burn-in board assembly during preparation for the burn-in process and during post burn-in handling 1090. Finally the IC modules or sockets to hold IC modules are mounted to the printed circuit board and the burn-in assembly is placed in a movable board rack to be ready for burn-in processing 1100.

While the invention has been particularly shown and described with reference to the preferred embodiments thereof, it will be understood by those skilled in the art that various changes in form and details may be made without departing from the spirit and scope of the invention.

What is claimed is:

1. A burn-in board assembly for the protection from electromagnetic interference as the result an electrostatic discharge event, of a plurality of integrated circuit modules in preparation for and in post handling from a burn-in operation within a burn-in chamber, comprising:

a) a printed circuit board onto which said plurality of integrated circuit modules is mounted for the burn-in operation;

b) an electrostatic discharge bypass track disposed upon the printed circuit board in close proximity to peripheral edges of said printed circuit board;

c) a first electromagnetic interference shielding trace disposed upon the printed circuit board at said peripheral edges of the printed circuit board between the stiffener frame and the area of the integrated circuit modules;

d) a second electromagnetic interference shielding trace disposed upon the printed circuit board at said peripheral edges of the printed circuit board between the first electromagnetic interference shielding trace and the area of the integrated circuit modules;

e) a first plurality of signal traces disposed upon the printed circuit board to conduct a plurality of electrical signal stimuli to the plurality of integrated circuit modules;

f) a second plurality of signal traces disposed upon the printed circuit board to conduct a plurality of electrical feedback sensing signals and a plurality of electrical signal responses from the integrated circuit modules;

g) a first plurality of connector means to couple the first and second signal traces to external control and test circuitry;

h) a first grounding connector means to couple the electrostatic discharge track and the first electromagnetic shielding traces to a ground reference point;

i) a second grounding connector means to couple the electrostatic discharge track and the second electromagnetic shielding traces to the ground reference point; and j) a stiffener frame secured to said printed circuit board to provide mechanical support and connected to said stiffener frame to provide a conductive path to discharge an electrostatic voltage source such as a human body that is coupled to the stiffener frame thus protecting the integrated circuit modules from damage as a result of an exposure to the electrostatic discharge voltage source.

2. The assembly of claim 1 wherein the stiffener frame has a rectangular form larger than the area of the integrated circuits modules.

3. The assembly of claim 1 wherein the discharge of the electrostatic discharge voltage source causes conduction of a current within the stiffener frame wherein said current induces an electromagnetic interference field.

4. The assembly of claim 3 wherein the electromagnetic interference field is shielded from interfering with the plurality of integrated circuit modules and with the plurality of electrical signal stimuli, the plurality of electrical feedback sensing signals, and the plurality of electrical signal responses by the first and second electromagnetic interference shielding traces.

5. The assembly of claim 1 wherein the plurality of integrated circuit modules may be mounted to the printed circuit board by soldering said plurality of integrated circuit modules to said printed circuit board.

6. The assembly of claim 1 wherein the plurality of integrated circuit modules may be mounted to the printed circuit board by plugging said plurality of integrated circuit modules into sockets soldered said printed circuit board.

7. A method to protect a plurality of integrated circuit modules during preparation for and in post handling from a burn-in operation within a burn-in chamber from electromagnetic interference from an electrostatic discharge event, comprising the steps of:

a) providing a printed circuit board onto which said plurality of integrated circuit modules is mounted for the burn-in operation;

b) placing an electrostatic discharge bypass track disposed upon the printed circuit board in close proximity to peripheral edges of said printed circuit board;

c) placing a first electromagnetic interference shielding trace disposed upon the printed circuit board at said peripheral edges of the printed circuit board between the stiffener frame and the area of the integrated circuit modules;

d) placing a second electromagnetic interference shielding trace disposed upon the printed circuit board at said peripheral edges of the printed circuit board between the first electromagnetic interference shielding trace and the area of the integrated circuit modules;

e) placing a first plurality of signal traces disposed upon the printed circuit board to conduct a plurality of electrical signal stimulants to the plurality of integrated circuit modules;

f) placing a second plurality of signal traces disposed upon the printed circuit board to conduct a plurality of electrical feedback sensing signals and a plurality of electrical signal responses from the integrated circuit modules;

g) connecting a first plurality of connector means to couple the plurality of electrical signal stimulants, the plurality of electrical feedback sensing signals and the plurality of electrical signal responses to external control and test circuitry;

h) connecting a first grounding connector means to couple the electrostatic discharge track and the first electromagnetic shielding traces to a ground reference point;

i) connecting a second grounding connector means to couple the electrostatic discharge track and the second electromagnetic shielding traces to the ground reference point;

j) placing said printed circuit board upon a stiffener frame wherein said stiffener frame is connected to the electrostatic discharge bypass track to provide a conductive path to discharge an electrostatic voltage source such as a human body that is coupled to the stiffener frame and soldering points located on a backplane of the printed circuit board thus protecting the integrated circuit modules from damage as a result of an exposure to the electrostatic discharge voltage source;

k) mounting the plurality of integrated circuit modules to the printed circuit card and said burn-in board assembly is placed into the burn-in chamber for the burn-in operation.

8. The method of claim 7 wherein the stiffener frame has a rectangular form larger than the area of the integrated circuits modules.

9. The method of claim 7 wherein the second electromagnetic interference shielding trace is disposed from the second grounding means around the circumference of the printed circuit board between the first electromagnetic interference shielding trace and the area of the integrated circuit modules.

10. The method of claim 7 wherein the discharge of the electrostatic discharge voltage source causes conduction of a current within the stiffener frame and said current induces an electromagnetic interference field.

11. The method of claim 10 wherein the electromagnetic interference field is shielded from interfering with the plurality of integrated circuit modules and with the plurality of electrical signal stimuli and the plurality of electrical signal responses by the first and second electromagnetic interference shielding traces.

12. The method of claim 7 wherein the plurality of integrated circuit modules may be mounted to the printed circuit board by soldering said plurality of integrated circuit modules to said printed circuit board.

13. The method of claim 7 wherein the plurality of integrated circuit modules may be mounted to the printed circuit board by plugging said plurality of integrated circuit modules into sockets soldered said printed circuit board.

14. A burn-in board backplane means for the prevention of damage to a plurality of integrated circuits during preparation for and in post handling from burn in testing from electromagnetic interference from an electrostatic discharge event, comprising:

a) a printed circuit board b) a plurality of integrated circuit modules mounted in an area of the printed circuit board;

c) an electrostatic discharge bypass track disposed upon the printed circuit board in close proximity to peripheral edges of said printed circuit board;

d) a first electromagnetic interference shielding trace disposed upon the printed circuit board in close proximity to peripheral edges of said printed circuit board;

e) a second electromagnetic interference shielding trace disposed upon the printed circuit board at said peripheral edges of the printed circuit board between the first electromagnetic interference shielding trace and the area of the integrated circuit modules;

f) a first plurality of signal traces disposed upon the printed circuit board to conduct a plurality of electrical signal stimulants to the plurality of integrated circuit modules;

g) a second plurality of signal traces disposed upon the printed circuit board to conduct a plurality of electrical feedback sensing signals and a plurality of electrical signal responses from the integrated circuit modules;

h) a first plurality of connector means to couple the plurality of electrical signal stimulants, the plurality of electrical feedback sensing signals and the plurality of electrical signal responses to external control and test circuitry;

i) a first grounding connector means to couple the electrostatic discharge track and the first electromagnetic shielding traces to a ground reference point;

j) a second grounding connector means to couple the electrostatic discharge track and the second electromagnetic shielding traces to the ground reference point; and k) a stiffener frame secured to said printed circuit board to provide mechanical support and connected to the electrostatic discharge bypass track to provide a conductive path to discharge an electrostatic voltage source such as a human body that is coupled to the stiffener frame and soldering points located on the backplane thus protecting the integrated circuit modules from damage as a result of an exposure to the electrostatic discharge voltage source.

15. The means of claim 14 wherein the stiffener frame has a rectangular form larger than the area of the integrated circuits modules.

16. The means of claim 14 wherein the first electromagnetic interference shielding trace is disposed from the first grounding first grounding means around the circumference of the printed circuit board between the stiffener frame and the area of the integrated circuit modules.

17. The means of claim 14 wherein the second electromagnetic interference shielding trace is disposed from the second means around the circumference of the printed circuit board between the first electromagnetic interference shielding trace and the area of the integrated circuit modules.

18. The means of claim 14 wherein the discharge of the electrostatic discharge voltage source causes conduction of a current within the stiffener frame wherein said current induces an electromagnetic interference field.

19. The means of claim 18 wherein the electromagnetic interference field is shielded from interfering with the plurality of integrated circuit modules and with the plurality of electrical signal stimuli the plurality of electrical feedback sensing signals and the plurality of electrical signal responses by the first and second electromagnetic interference shielding traces.

20. The means of claim 14 wherein said damage to the plurality of integrated circuit modules is from the discharge of the electrostatic discharge voltage source during preparation for and in post handling of a burn-in operation within a burn-in chamber.

21. The means of claim 14 wherein the plurality of integrated circuit modules may be mounted to the printed circuit board by soldering said plurality of integrated circuit modules to said printed circuit board.

22. The means of claim 14 wherein the plurality of integrated circuit modules may be mounted to the printed circuit board by plugging said plurality of integrated circuit modules into sockets soldered said printed circuit board.

* * * * *